United States Patent
Mor et al.

(10) Patent No.: US 8,659,097 B2
(45) Date of Patent: Feb. 25, 2014

(54) CONTROL FIN HEIGHTS IN FINFET STRUCTURES

(75) Inventors: Yi-Shien Mor, Hsin-Chu (TW); Hsiao-Chu Chen, Caotun Township (TW); Mu-Chi Chiang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/351,135

(22) Filed: Jan. 16, 2012

(65) Prior Publication Data
US 2013/0181300 A1    Jul. 18, 2013

(51) Int. Cl.
*H01L 27/088* (2006.01)
*H01L 29/78* (2006.01)

(52) U.S. Cl.
USPC .......................................... 257/401; 257/412

(58) Field of Classification Search
USPC ................................................ 257/401, 412
See application file for complete search history.

(56) References Cited

U.S. PATENT DOCUMENTS

| | | | |
|---|---|---|---|
| 6,867,433 B2 * | 3/2005 | Yeo et al. ..................... | 257/67 |
| 7,635,893 B2 * | 12/2009 | Weis et al. ................... | 257/332 |
| 7,923,337 B2 * | 4/2011 | Chang et al. ................. | 438/303 |
| 7,989,855 B2 * | 8/2011 | Narihiro ....................... | 257/288 |
| 8,106,459 B2 * | 1/2012 | Chang et al. ................. | 257/353 |
| 8,263,462 B2 * | 9/2012 | Hung et al. ................... | 438/286 |
| 8,362,572 B2 * | 1/2013 | Huang et al. ................. | 257/386 |
| 8,373,238 B2 * | 2/2013 | Lee et al. ..................... | 257/401 |
| 2004/0217420 A1 * | 11/2004 | Yeo et al. ...................... | 257/347 |
| 2007/0096182 A1 * | 5/2007 | Schloesser et al. ........... | 257/296 |
| 2007/0241414 A1 * | 10/2007 | Narihiro ....................... | 257/401 |
| 2008/0315309 A1 * | 12/2008 | Chang et al. .................. | 257/346 |
| 2009/0032887 A1 | 2/2009 | Jang et al. | |
| 2009/0302372 A1 * | 12/2009 | Chang et al. .................. | 257/327 |
| 2011/0049599 A1 * | 3/2011 | Taketani ....................... | 257/302 |
| 2011/0068407 A1 | 3/2011 | Yeh et al. | |
| 2011/0121406 A1 * | 5/2011 | Lee et al. ..................... | 257/401 |
| 2011/0133292 A1 * | 6/2011 | Lee et al. ..................... | 257/401 |
| 2011/0147811 A1 * | 6/2011 | Kavalieros et al. ........... | 257/288 |
| 2011/0244668 A1 * | 10/2011 | Narihiro ....................... | 438/479 |
| 2012/0043611 A1 * | 2/2012 | Mouli et al. .................. | 257/347 |
| 2012/0083107 A1 * | 4/2012 | Chang et al. ................. | 438/585 |
| 2012/0217587 A1 * | 8/2012 | Wang ........................... | 257/401 |
| 2012/0241818 A1 * | 9/2012 | Kavalieros et al. ........... | 257/192 |
| 2012/0306082 A1 * | 12/2012 | Sekar et al. .................. | 257/758 |
| 2012/0313227 A1 * | 12/2012 | Or-Bach et al. .............. | 257/659 |
| 2012/0319211 A1 * | 12/2012 | van Dal et al. ............... | 257/401 |
| 2013/0011983 A1 * | 1/2013 | Tsai et al. ..................... | 438/285 |
| 2013/0011984 A1 * | 1/2013 | Wang et al. .................. | 438/285 |
| 2013/0056826 A1 * | 3/2013 | Liu et al. ...................... | 257/347 |
| 2013/0082329 A1 * | 4/2013 | Chen et al. ................... | 257/347 |

FOREIGN PATENT DOCUMENTS

| | | | |
|---|---|---|---|
| KR | 100823874 B1 | 4/2008 | |
| KR | 20090012793 A | 2/2009 | |
| KR | 20110033033 A | 3/2011 | |

* cited by examiner

*Primary Examiner* — Ngan Ngo
(74) *Attorney, Agent, or Firm* — Slater & Matsil, L.L.P.

(57) ABSTRACT

A device includes a substrate, an isolation region at a top surface of the substrate, and a semiconductor fin over the isolation region. The semiconductor fin has a fin height smaller than about 400 Å, wherein the fin height is measured from a top surface of the semiconductor fin to a top surface of the isolation region.

12 Claims, 13 Drawing Sheets

CONTROL FIN HEIGHTS IN FINFET STRUCTURES

BACKGROUND

With the increasing down-scaling of integrated circuits and increasingly demanding requirements to the speed of integrated circuits, transistors need to have higher drive currents with smaller dimensions. Fin Field-Effect Transistors (Fin-FET) were thus developed. FinFET transistors have increased channel widths. The increase in the channel widths is achieved by forming channels that include portions on the sidewalls of the fins and portions on the top surfaces of the fins. Since the drive currents of transistors are proportional to the channel widths, the drive currents of FinFETs are increased.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A Fin Field-Effect Transistor (FinFET) related structure and the method of forming the same are provided in accordance with various embodiments. The intermediate stages of forming the FinFET are illustrated. The variations of the embodiments are discussed. Throughout the various views and illustrative embodiments, like reference numbers are used to designate like elements.

Figure 1:
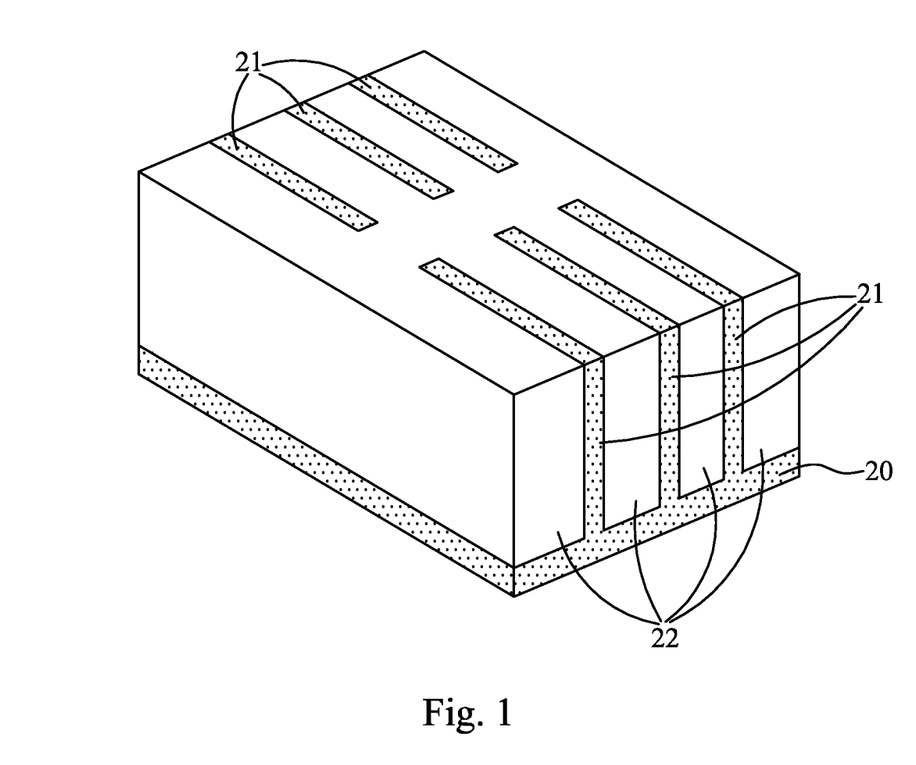
FIGS. 1 through 7 are cross-sectional views and perspective views of intermediate stages in the manufacturing of a Fin Field-Effect Transistor (FinFET) related structure in accordance with various exemplary embodiments.

FIGS. 1 through 7 are cross-sectional views and perspective views of intermediate stages in the manufacturing of a FinFET-related structure in accordance with some exemplary embodiments. FIG. 1 illustrates a perspective view of an initial structure. The initial structure includes substrate 20. Substrate 20 may be a semiconductor substrate, which may further be a silicon substrate, a silicon germanium substrate, a silicon carbon substrate, or a substrate formed of other semiconductor materials. Substrate 20 may be doped with a p-type or an n-type impurity. Isolation regions such as Shallow Trench Isolation (STI) regions 22 may be formed in substrate 20. Width W of STI region 22 may be smaller than about 500 Å, and may be smaller than about 50 Å. The portions of substrate 20 between neighboring STI regions 22 form semiconductor strips 21.

Figure 2:
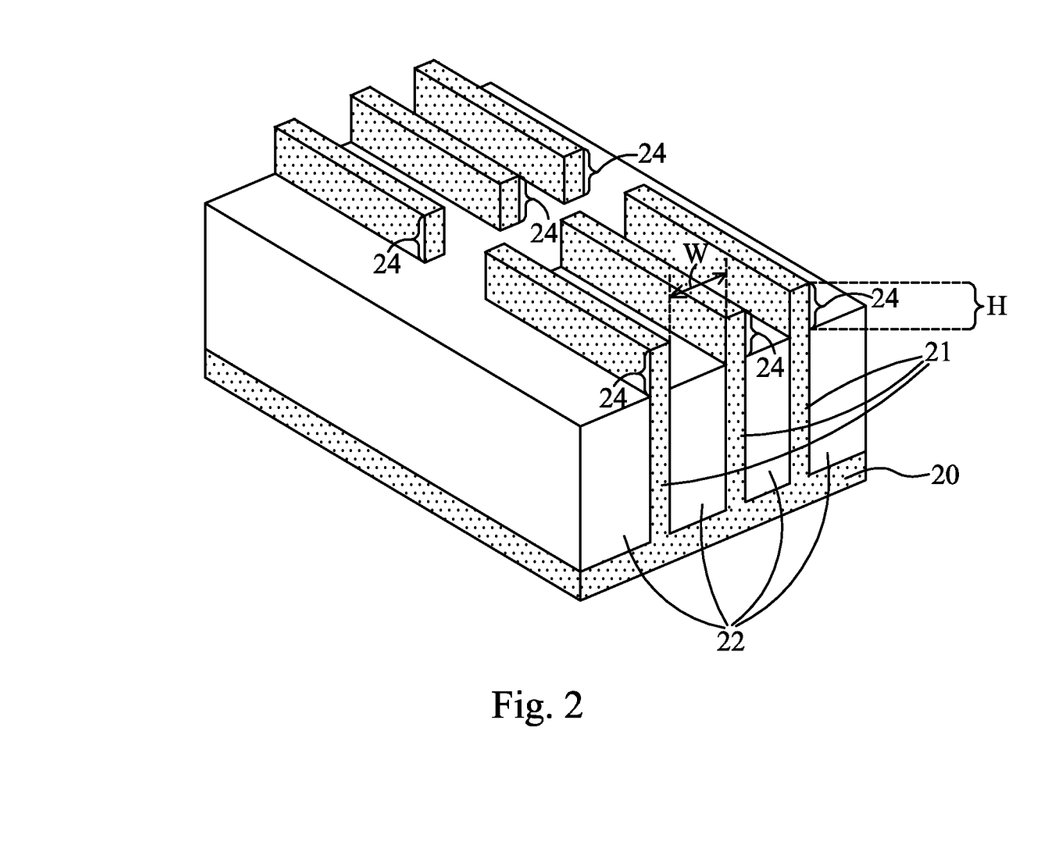

Referring to FIG. 2, STI regions 22 are recessed through an etching step. Portions of semiconductor strips 21 are thus over the top surfaces of the remaining STI regions 22. The portions of semiconductor strips 21 over the top surfaces of the remaining STI regions 22 are referred to as semiconductors fins 24 hereinafter. Semiconductor fins 24 thus have STI regions 22 therebetween, and edges of semiconductor fins 24 are substantially aligned to edges of the corresponding STI regions 22. In some embodiments, height H of fin 24 is smaller than about 400 Å, and may be smaller than about 250 Å. The portions of semiconductor strips 21 that are under semiconductor fins 24 have edges contacting the edges of STI regions 22. Furthermore, semiconductor strips 21 and semiconductor fins 24 may be formed of a same semiconductor material.

Figure 3A:
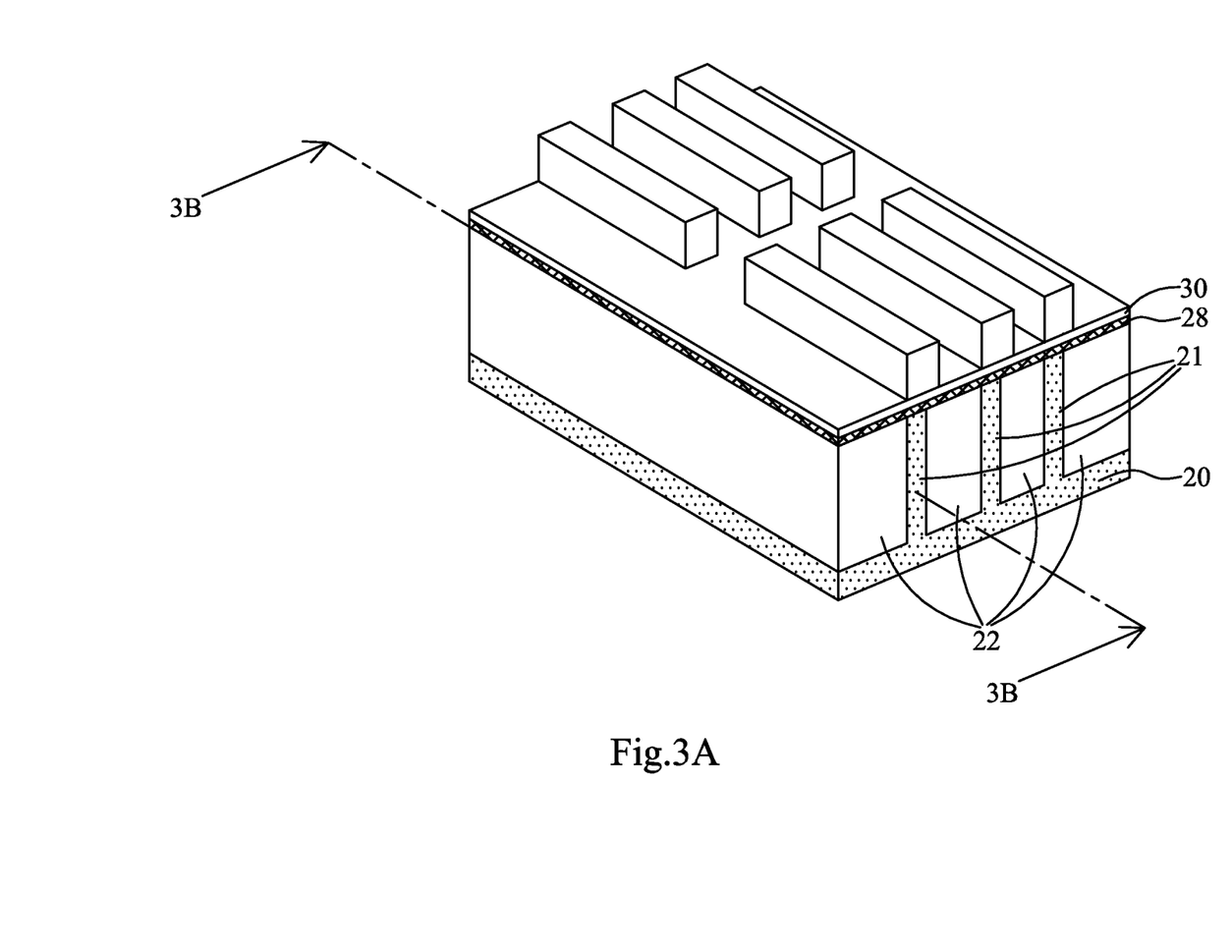
Figure 3B:
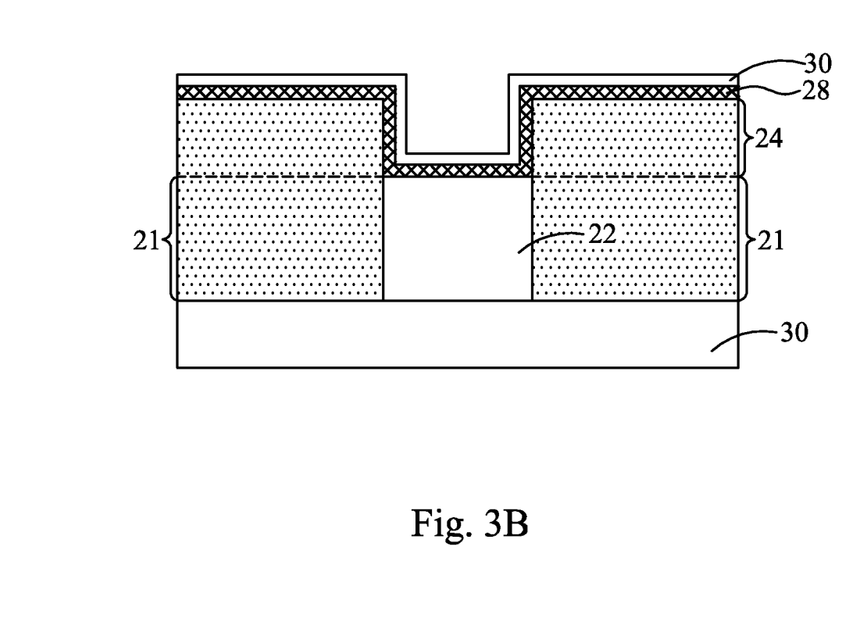

Referring to FIGS. 3A and 3B, dielectric layer 28 is formed on the top surfaces and sidewalls of fins 24. FIG. 3A illustrates a perspective view. FIG. 3B illustrates a cross-sectional view obtained from the plane crossing line 3B-3B in FIG. 3A. In accordance with some embodiments, dielectric layer 28 comprises silicon oxide, silicon nitride, or multilayers thereof. In alternative embodiments, dielectric layer 28 is formed of a high-k dielectric material, and hence is alternatively referred to as high-k dielectric layer 28 throughout the description. High-k dielectric layer 28 may have a k value greater than about 7.0, and may include an oxide or a silicate of Hf, Al, Zr, La, Mg, Ba, Ti, Pb, and combinations thereof. Exemplary materials of high-k dielectric layer 28 include $MgO_x$, $BaTi_xO_y$, $BaSr_xTi_yO_z$, $PbTi_xO_y$, $PbZr_xTi_yO_z$, and the like, with values X, Y, and Z being between 0 and 1. One skilled in the art will realize, however, that the dimensions recited throughout the specification are examples, and may be changed to different values. The formation methods of dielectric layer 28 may include Molecular-Beam Deposition (MBD), Atomic Layer Deposition (ALD), Physical Vapor Deposition (PVD), and the like.

Over dielectric layer 28, capping layer 30 is formed. In some embodiments, capping layer 30 may be a metal-containing layer, and hence may sometimes be referred to as metal layer 30. Capping layer 30 may comprise titanium nitride (TiN) in accordance with some embodiments. In alternative embodiments, the exemplary materials of capping layer 30 include tantalum-containing materials and/or titanium-containing materials such as TaC, TaN, TaAlN, TaSiN, TiN, TiAl, Ru, and combinations thereof.

Figure 4A:
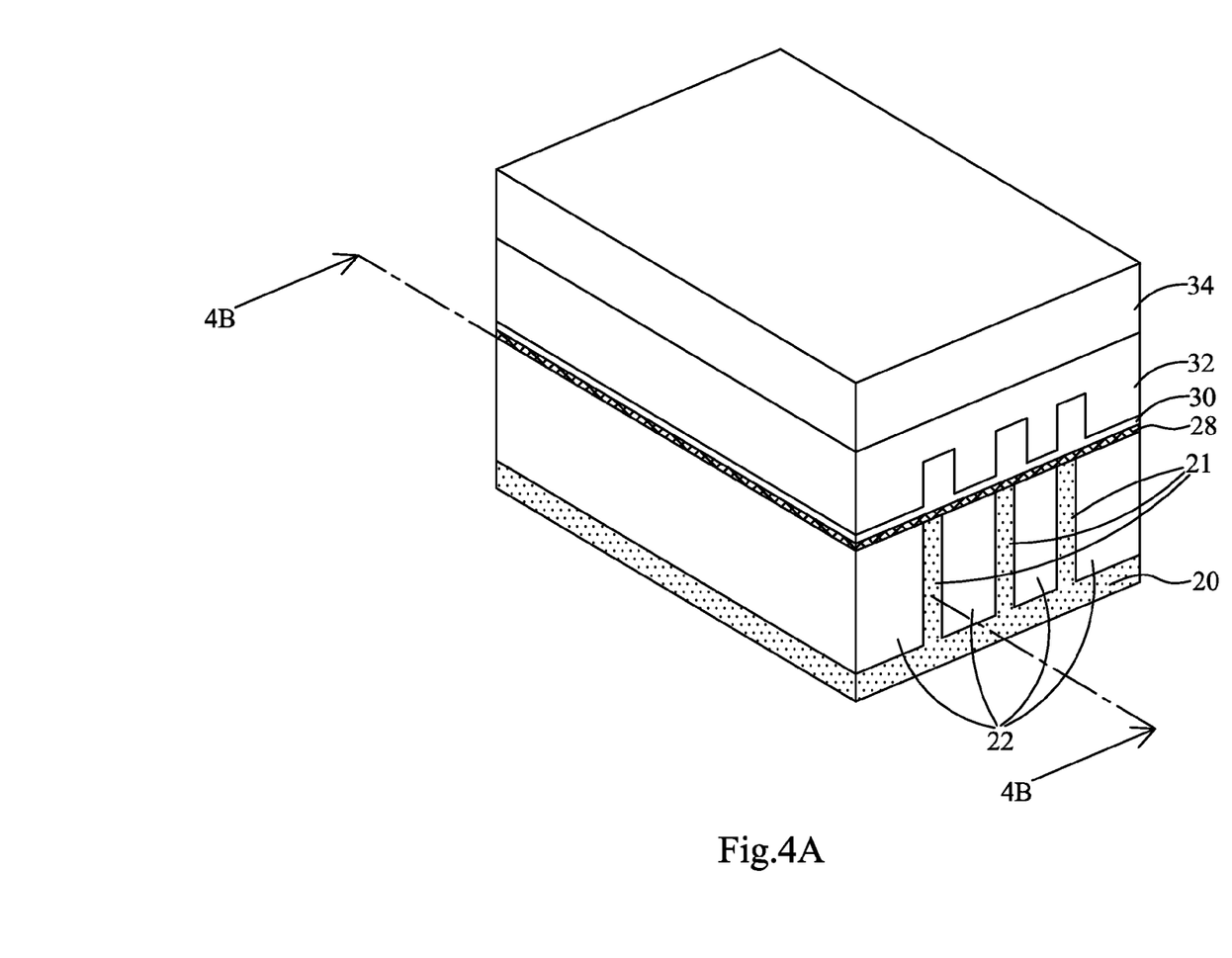
Figure 4B:
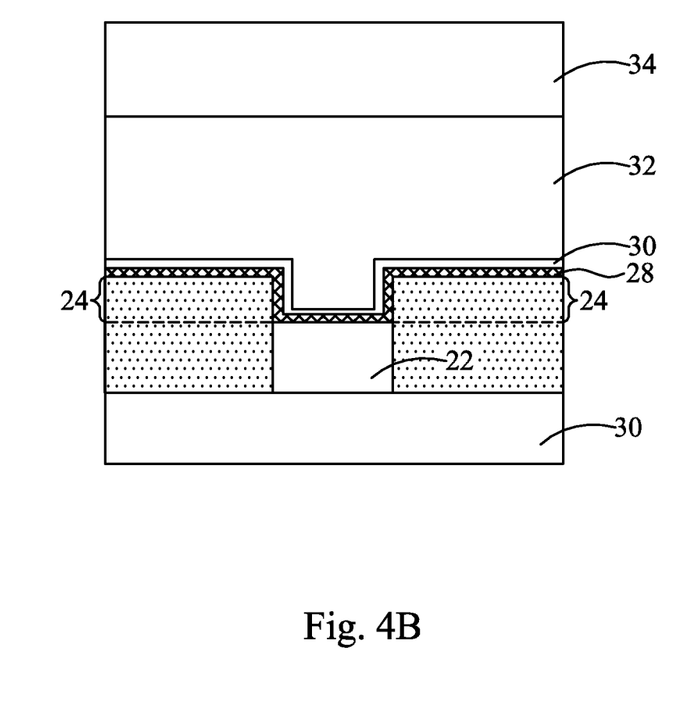

FIGS. 4A and 4B illustrate a perspective view and a cross-sectional view, respectively, of the formation of polysilicon layer 32 and hard mask layer 34. The cross-sectional view shown in FIG. 4B is obtained from the plane crossing line 4B-4B in FIG. 4A. First, polysilicon layer 32 is deposited, followed by a Chemical Mechanical Polish (CMP) to level the top surface of polysilicon layer 32. Hard mask layer 34 is then formed over polysilicon layer 32. Hard mask layer 34 may be formed of silicon nitride, for example, although other materials such as silicon oxide may also be used.

Figure 5:
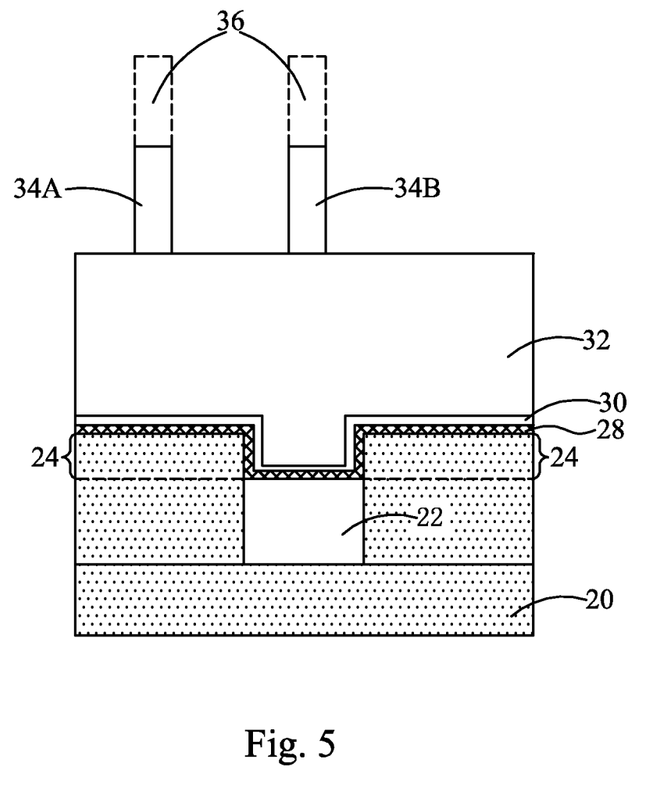

In FIG. 5, hard mask layer 34 is patterned, and the remaining portions of hard mask layer 34 comprise hard mask patterns 34A and 34B. To pattern hard mask layer 34, photo resist 36 may be formed and patterned first, and the patterned photo resist 36 is then used as an etching mask to pattern hard mask layer 34. The patterned photo resist 36 is then removed. Hard mask pattern 34A is over a portion of fin 24, and hard mask pattern 34B is over a portion of STI region 22.

Figure 6A:
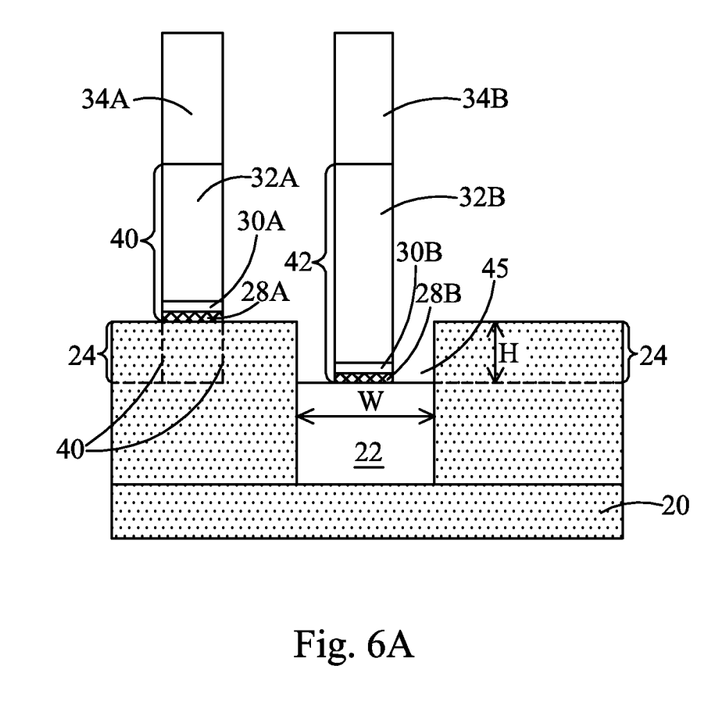
Figure 6B:
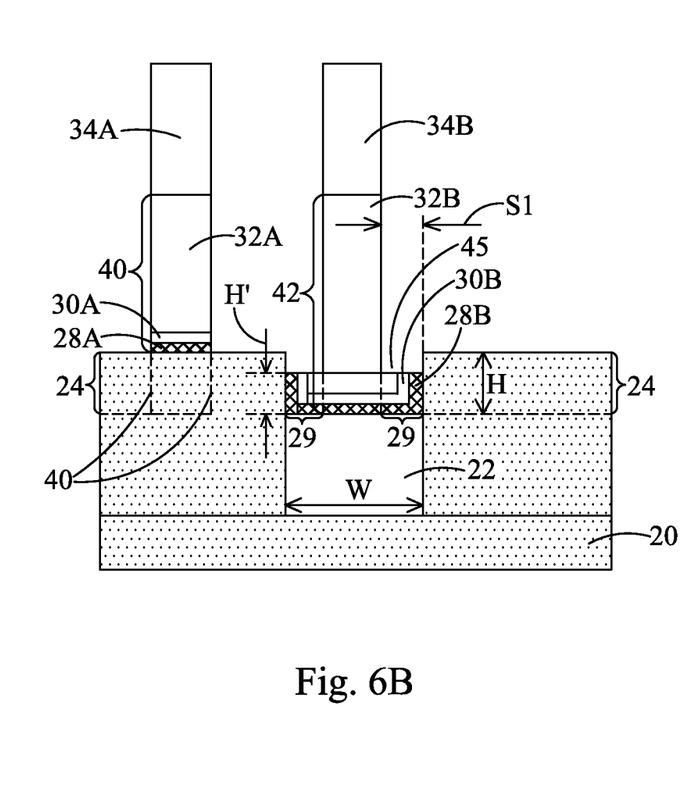

Next, as shown in FIG. 6A, hard mask patterns 34A and 34B are used as etching masks to etch the underlying polysilicon layer 32, capping layer 30, and dielectric layer 28. As a result, gate stack 40 is formed over fin 24, and stacked layers 42 are formed over STI region 22. Gate stack 40 comprises polysilicon layer 32A, metal layer 30A, and dielectric layer 28A. Stacked layers 42 comprise polysilicon layer 32B, metal layer 30B, and dielectric layer 28B. Gate stack 40 may also be formed on the sidewalls of fin 24, as indicated by dashed lines. In some embodiments, there are substantially no residue of gate dielectric layer 28, metal layer 30, and polysilicon layer 32 left on the sides of stacked layers 42, and the edges of polysilicon layer 32B, metal layer 30B, and dielectric layer 28B may be substantially straight and vertical, and may be substantially aligned to each other. In some situations, however, the residues of gate dielectric layer 28, metal layer 30, and polysilicon layer 28 may be undesirable left over STI region 22. The resulting structure is illustrated in FIG. 6B. It was found that whether the residues are formed or not formed may be affected by fin height H of fins 24. When fin height H is smaller than about 400 Å, the residues were not form. When fin height H is greater than about 400 Å, however, the residues start to be formed, and the greater the fin height H is, the more residue may be found. The residues are schematically illustrated as 29 in FIG. 6B. In accordance with some embodiments, to form the residue-free structure, fin height H may be smaller than about 400 Å, and may further be smaller than about 250 Å. In the embodiments, by controlling the fin height to smaller than a critical value of 250 Å, the residues of gate dielectric layer 28, metal layer 30, and the polysilicon layer 32 may be substantially eliminated from over STI region 22.

Figure 8:
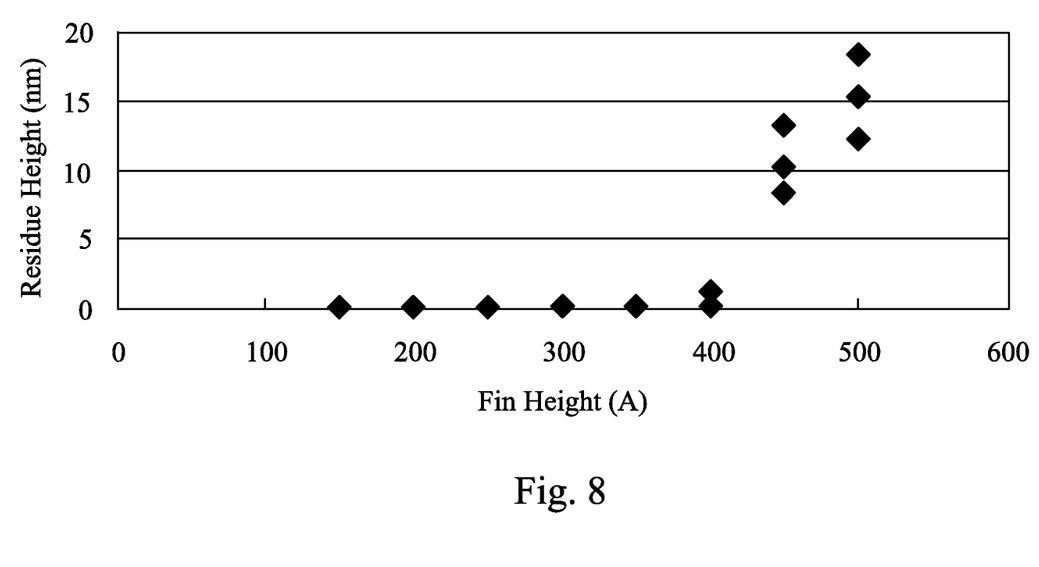
FIGS. 8 and 9 illustrate experiment results.

Experiment results indicated that fin height H has a significant effect on the amount of residue remaining in trench 45. FIG. 8 illustrates the experiment result obtained from sample wafers, wherein height H' (FIG. 6) of the residues in trench 45 is illustrated as a function of fin height H. Trench 45 is a portion of the space that is over the recessed STI region 22, and between neighboring fins 24. The experiment results are unexpected in that when fin height H is smaller than about 400 Å, height H' of the residues is substantially equal to 0 Å, and substantially no residue is left. When the fin height is greater than about 400 Å, however, height H' of the residues quickly rises.

Figure 9:
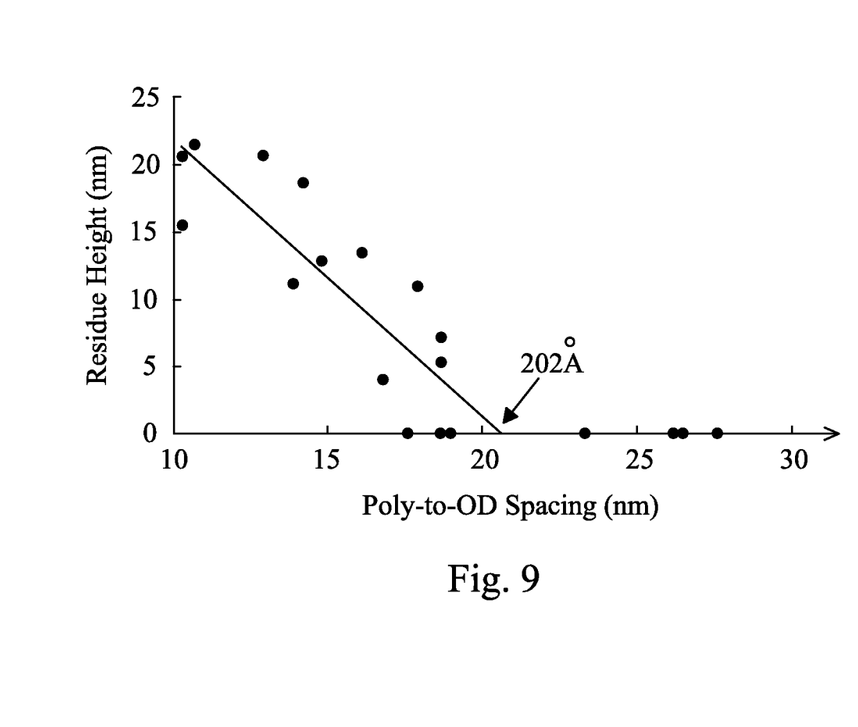

Experiment results also indicated that poly-to-OD spacing S1 (FIG. 6B) also has an effect on the amount of residue remaining in trench 45. FIG. 9 illustrates the experiment result obtained from sample wafers, and a fit line is made, wherein height H' (FIG. 6) of the residues in trench 45 is illustrated as a function of fin height H. The experiment results indicated that when poly-to-OD spacing S1 is greater than about 200 Å, height H' of the residues is substantially equal to 0 Å, and substantially no residue is left. Accordingly, in accordance with embodiments, poly-to-OD spacing S1 is greater than about 200 Å.

It is further appreciated that the width W of STI region 22 also has the effect on whether the residues will be formed or not. It is noted that width W is also the spacing of neighboring fins 24. In accordance with some embodiments, width W of STI region 22 may be smaller than about 100 Å. The aspect ratio H/W of trench 45 may be smaller than about 13, and may also be smaller than about 5.

Figure 6C:
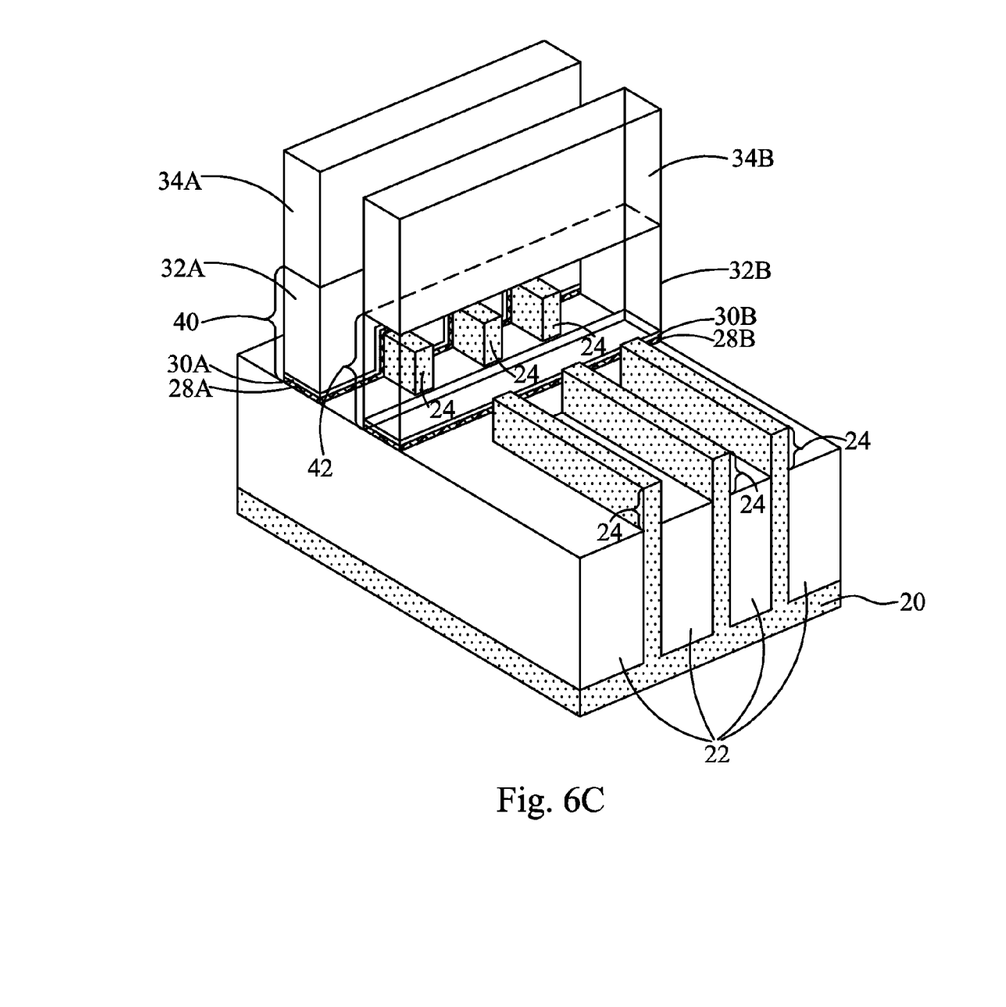

FIG. 6C illustrates a perspective view of the structure shown in FIG. 6A. For the structure that is behind polysilicon strip 32B to be shown clearly, polysilicon strip 32B is illustrated as transparent. FIG. 6C illustrates that gate stack 40 is over, and crosses, fin 24. Stacked layers 42 are between neighboring fins 24, and are spaced apart from fins 24.

Figure 7:
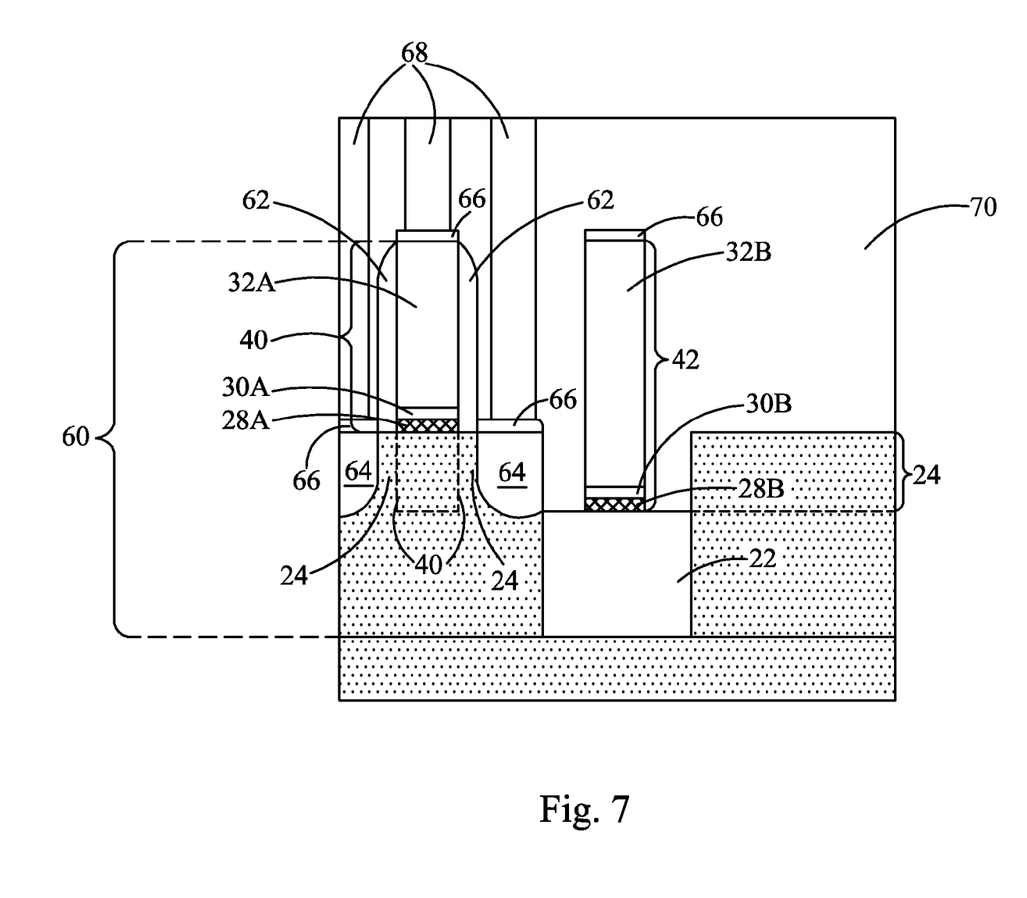

In a subsequent step, hard mask patterns 34A and 34B are removed, as shown in FIG. 7. In Subsequent steps, as also shown in FIG. 7, FinFET 60 is formed, wherein gate stack 40 acts as the gate stack of FinFET 60. Stacked layers 42 may act as a dummy pattern, which is electrically floating. Alternatively, stacked layers 42 may act as the electrical connection between devices. For example, stacked layers 42 may act as the electrically connection between the gates of two FinFETs (not shown).

FinFET 60 may include gate spacers 62, source and drain regions 64, silicide regions 66, contact plugs 68, and Inter-Layer Dielectric (ILD) 70. In some embodiments, the formation of source and drain regions 64 may also comprise etching portions of fin 24 that are not covered by gate stack 40, and performing an epitaxy to grow stressors (not shown, which may be silicon germanium or silicon carbon). The stressors are then implanted to form source/drain regions 64. In alternative embodiments, fin 24 is not recessed, and an epitaxy may be performed to grow an epitaxy region on fin 24 to enlarge source and drain regions 64. At the time source and drain regions 64 is formed by the implantation, stacked layers 42 may also be implanted to reduce the resistivity.

In accordance with embodiments, a device includes a substrate, an isolation region at a top surface of the substrate, and a semiconductor fin over the isolation region. The semiconductor fin has a fin height smaller than about 400 Å, wherein the fin height is measured from a top surface of the semiconductor fin to a top surface of the isolation region.

In accordance with other embodiments, a device includes a semiconductor substrate, STI regions adjacent to a surface of the semiconductor substrate, and a first and a second semiconductor strip comprising sidewalls contacting opposite sidewalls of the STI regions. The device further includes a first and a second semiconductor fin over and joining the first and the second semiconductor strips, respectively. The fin heights of the first and the second semiconductor fins are smaller than about 400 Å.

In accordance with yet other embodiments, a method includes forming an STI region in a semiconductor substrate, wherein portions of the semiconductor substrate on opposite sides of the STI region form semiconductor strips. The method further includes recessing the STI region to form a recess. The top portions of the semiconductor strips form a first and a second semiconductor fin having fin heights smaller than about 400 Å, wherein the fin heights are measured from top surfaces of the first and the second semiconductor fins to a top surface of the STI region.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:
1. A device comprising:
a semiconductor substrate;
a Shallow Trench Isolation (STI) region adjacent to a surface of the semiconductor substrate;
a first and a second semiconductor strip comprising sidewalls and ends contacting edges of the STI region, wherein the first and the second semiconductor strips have lengthwise directions aligned to a straight line;

a first and a second semiconductor fin over and joining the first and the second semiconductor strips, respectively, wherein fin heights of the first and the second semiconductor fins are smaller than about 400 Å, and wherein the semiconductor fin is comprised in a Fin Field-Effect Transistor (FinFET); and a gate stack overlapping the STI region, wherein the gate stack is between the first and the second semiconductor fins, with no additional gate stack and no additional semiconductor fins between the gate stack and the first and the second semiconductor fins, and wherein the gate stack has a lengthwise direction perpendicular to the straight line.

2. The device of claim 1, wherein the first and the second semiconductor fins have a spacing smaller than about 500 Å.

3. The device of claim 1, wherein the FinFET further comprises:

a gate dielectric layer;

a metal layer over the gate dielectric layer; and a polysilicon layer over the metal layer, wherein the gate dielectric layer, the metal layer, and the polysilicon layer extend on a top surface and sidewalls of the first semiconductor fin.

4. The device of claim 1, wherein the first and the second semiconductor strips and the first and the second semiconductor fins are formed of a same semiconductor material.

5. A device comprising:

a substrate;

an isolation region at a top surface of the substrate; and a first semiconductor fin, wherein the first semiconductor fin has a fin height smaller than about 400 Å, wherein the fin height is measured from a top surface of the first semiconductor fin to a top surface of the isolation region, and wherein an end of the semiconductor fin is aligned to an edge of the isolation region;

a first gate dielectric layer and a gate electrode layer forming a Fin Field-Effect Transistor (FinFET) with the first semiconductor fin;

a second gate dielectric layer overlapping a portion of the isolation region, wherein a bottom surface of the second gate dielectric layer is in contact with a top surface of the isolation region; and a polysilicon layer overlapping the second gate dielectric layer, wherein the polysilicon layer and the first semiconductor fin have a spacing greater than about 200 Å.

6. The device of claim 5 further comprising a second semiconductor fin spaced apart from the first semiconductor fin, with the isolation region between the first and the second semiconductor fins, wherein edges of the first and the second semiconductor fins are substantially aligned to opposite edges of the isolation region, and wherein the first semiconductor fin and the second semiconductor fin have a distance smaller than about 500 Å.

7. The device of claim 6, wherein a ratio of the fin height to the distance is smaller than about 13.

8. The device of claim 5 further comprising a semiconductor strip underlying and connected to the first semiconductor fin, wherein the semiconductor strip comprises an edge contacting the edge of the isolation region, and wherein the semiconductor strip and the first semiconductor fin are formed of a same semiconductor material.

9. The device of claim 1, wherein the gate stack is spaced apart from the first and the second fins by a space greater than about 200 Å.

10. The device of claim 1, wherein the gate stack is a dummy pattern, and is electrically floating.

11. The device of claim 1, wherein the polysilicon layer is spaced apart from the FinFET.

12. The device of claim 5, wherein the polysilicon layer is a dummy pattern, and is electrically floating.

* * * * *